United States Patent
Emoto et al.

(10) Patent No.: US 6,836,031 B2
(45) Date of Patent: Dec. 28, 2004

(54) LINEAR MOTOR AND EXPOSURE APPARATUS USING THE SAME

(75) Inventors: Keiji Emoto, Kanagawa (JP); Kazuhito Outuka, Tokyo (JP); Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 09/998,691

(22) Filed: Dec. 3, 2001

(65) Prior Publication Data

US 2002/0089239 A1 Jul. 11, 2002

(30) Foreign Application Priority Data

Dec. 8, 2000 (JP) .......................................... 2000-374939

(51) Int. Cl.[7] .............................................. H02K 41/00
(52) U.S. Cl. ............................ 310/12; 310/13; 310/14
(58) Field of Search ............................. 310/12–35, 179, 310/208

(56) References Cited

U.S. PATENT DOCUMENTS

| | | | | |
|---|---|---|---|---|
| 4,131,988 A | * | 1/1979 | Finegold ....................... | 29/596 |
| 4,340,833 A | | 7/1982 | Sudo et al. .................. | 310/268 |
| 4,602,175 A | * | 7/1986 | Castagna ...................... | 310/13 |
| 4,618,789 A | * | 10/1986 | Flisikowski .................. | 310/13 |
| 4,760,294 A | | 7/1988 | Hansen ......................... | 310/13 |
| 4,816,710 A | * | 3/1989 | Silvaggio et al. ........... | 310/194 |
| 4,975,611 A | * | 12/1990 | Rochester .................... | 310/194 |
| 5,519,266 A | * | 5/1996 | Chitayat ....................... | 310/12 |
| 5,808,381 A | | 9/1998 | Aoyama et al. .............. | 310/12 |
| 6,002,465 A | | 12/1999 | Korenaga ..................... | 355/53 |
| 6,011,339 A | * | 1/2000 | Kawakami ................... | 310/208 |
| 6,084,319 A | * | 7/2000 | Kamata et al. ............... | 310/12 |
| 6,107,703 A | | 8/2000 | Korenaga ..................... | 310/12 |
| 6,226,073 B1 | | 5/2001 | Emoto .......................... | 355/53 |
| 6,262,794 B1 | | 7/2001 | Miyajima ..................... | 355/53 |
| 6,265,793 B1 | * | 7/2001 | Korenaga ..................... | 310/12 |
| 6,266,133 B1 | | 7/2001 | Miyajima et al. ............. | 355/72 |
| 6,278,205 B1 | * | 8/2001 | Reinhold .................. | 310/67 R |
| 6,320,649 B1 | | 11/2001 | Miyajima et al. ............. | 355/72 |
| 2002/0081528 A1 | | 6/2002 | Miyajima et al. ........... | 430/302 |

FOREIGN PATENT DOCUMENTS

| | | |
|---|---|---|
| JP | 8-107665 | 4/1996 |
| JP | 10-12539 | 1/1998 |
| JP | 10-309071 | * 11/1998 |
| JP | 11-122904 | 4/1999 |
| JP | 2000-209838 | 7/2000 |
| JP | 2000-261997 | 9/2000 |
| JP | 2000-324789 | 11/2000 |

* cited by examiner

*Primary Examiner*—Dang Le
(74) *Attorney, Agent, or Firm*—Fitzpatrick, Cella, Harper & Scinto

(57) ABSTRACT

Some of linear motors which constitute an exposure apparatus have coils each obtained by winding a copper foil wire as a foil-like conductor having an insulating layer around a core member in a multilayered structure. The coil is fixed to a positioning portion serving as the coil fixing portion of the linear motor by using the core member. The core member is formed from the same insulating material with low thermal conductivity as that of the positioning portion of a linear motor housing or a material with almost the same linear expansion coefficient.

12 Claims, 22 Drawing Sheets

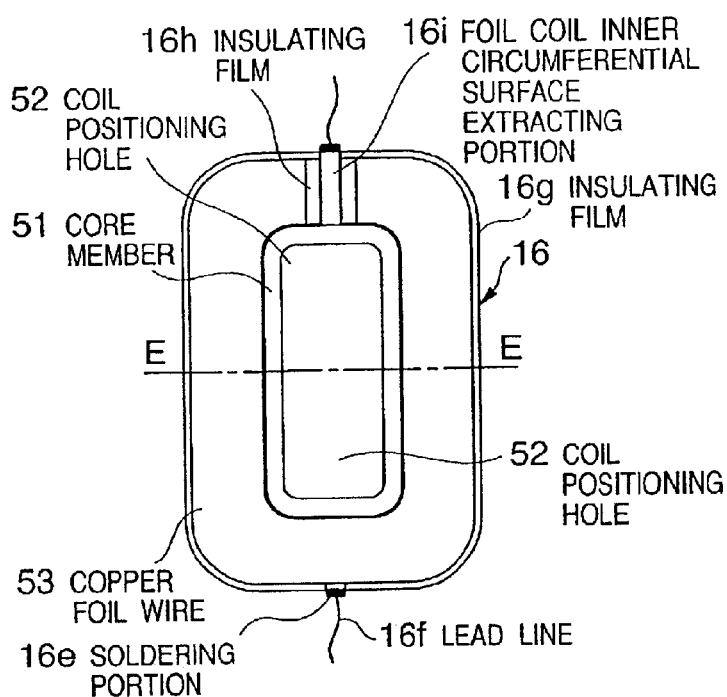
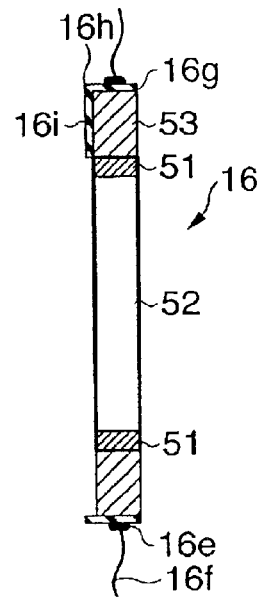
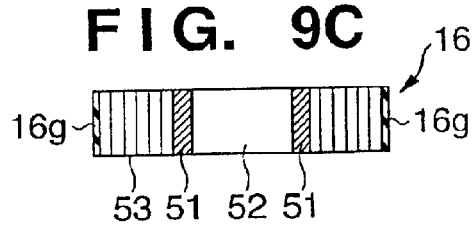
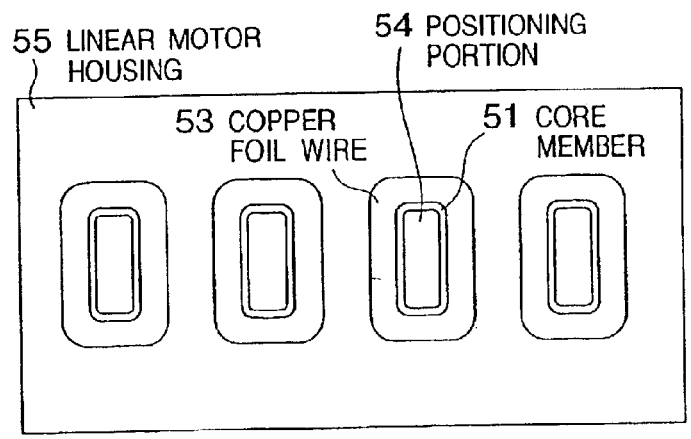
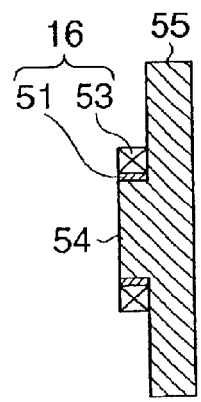

109 X LINEAR MOTOR (112 YL LINEAR MOTOR, 113 YR LINEAR MOTOR)

116 COIL
118 CONNECTOR

119 MOVABLE MAGNET
116 COIL

FIG. 20

| URL | http://www.maintain.co.jp/db/input.html |

TROUBLE DB INPUT WINDOW

OCCURRENCE DATE [2000/3/15] ~1404
TYPE OF APPARATUS [*********] ~1401
OBJECT [OPERATION ERROR (START-UP ERROR)] ~1403
DEVICE S/N [465NS4580001] ~1402
DEGREE OF URGENCY [D] ~1405
SYMPTOM [LED KEEPS FLICKERING AFTER POWERON] ~1406
REMEDY [POWER ON AGAIN (PRESS RED BUTTON IN ACTIVATION)] ~1407
PROGRESS [INTERIM HAS BEEN DONE] ~1408

[SEND] [RESET]    1410          1411              1412
LINK TO RESULT LIST DATABASE   SOFTWARE LIBRARY   OPERATION GUIDE

SEMICONDUCTOR DEVICE MANUFACTURING FLOW

LINEAR MOTOR AND EXPOSURE APPARATUS USING THE SAME

FIELD OF THE INVENTION

The present invention relates to an exposure apparatus used in a semiconductor manufacturing process and, more particularly, to a linear motor which is suitable for a projection exposure apparatus for projecting and transferring a reticle pattern onto a silicon wafer, and is suitable for moving a reticle and wafer on reticle and wafer stages for sequentially moving the reticle and silicon wafer with respect to a projection exposure system when projecting a reticle pattern onto the wafer.

The present invention relates to a linear motor suitable for transmitting the reaction forces of the reticle and wafer stages of an exposure apparatus, or a linear motor suitable for damping that is set on the mount of a main body structure which supports each stage and a projection optical system.

BACKGROUND OF THE INVENTION

FIGS. 17A and 17B schematically show the coil of a linear motor and a coil fixing method in a conventional exposure apparatus. FIG. 17A is a plan view, and FIG. 17B is a cross-sectional view. As shown in FIG. 16, a coil 116 uses a round wire coil 116a, and is constituted such that a round wire obtained by covering an insulating a copper wire 116b with an insulating layer 116c of polyimide or the like is wound into a corner-rounded rectangular shape. The coil 116 has a hollow structure. In other words, the inside of the conductor-wounded coil 116 is hollow like a so-called doughnut shape.

The coil 116 is fixed to a linear motor main body by fitting positioning portions 154 in the hollow coil portion. In general, the coil positioning precision greatly influences the thrust performance of a linear motor, so the positioning precision required to fix a coil is very strict. Particularly, a linear motor used for nm-order positioning in an exposure apparatus or the like often requires a coil fixing precision of 100 μm or less. Along with recent increases in the output and efficiency of linear motors, the linear motors are using a foil coil wounded with a copper foil-like film with which the coil wire moment can be designed higher than with a round wire.

A linear motor used in an exposure apparatus together with a hollow coil has a structure as shown in FIGS. 15A and 15B. In FIGS. 15A and 15B, a plurality of coils 116 are aligned within an effective stroke in the driving direction of a linear motor 109, and the lead line of each coil 116 is connected to a connector 118. A member movable with respect to the linear motor stationary member incorporates movable magnets 119. By flowing a driving current through the coils 116, the movable magnets 119 magnetized by a Lorentz force as shown in FIG. 15B are moved in a moving direction indicated by the arrow. This linear motor is used for a wafer stage or the like in an exposure apparatus.

The structure using the hollow portion of a hollow coil for coil positioning, like the above prior art, suffers the following problems.

1. In order to precisely fix the coil to the linear motor main body, the dimensional precision of an inner coil surface must be increased. The inner coil surface is made of a wire, so the dimensional precision must be increased by grinding the inner coil surface. If the dimensional precision does not increase, it adversely affects the positioning precision of a positioning device and the exposure precision of an exposure apparatus. To prevent this, the winding precision must be very strict even in winding a wire, which poses technical and cost problems.

2. In forming a coil, a wire is wound around a winding jig (to be referred to as a core member hereinafter) having a shape corresponding to an inner coil shape. Then, the core member is removed. However, it is technically difficult and costly to remove the core member while keeping high dimensional precision of the inner coil surface.

3. Even if problems 1 and 2 are solved and a high-precision coil can be formed, the wire may be damaged in assembling the coil into a linear motor housing. Although the positioning precision for fixing the coil must be high, the coil must be loosely fitted on the linear motor housing. Thus, the coil and exposure apparatus cannot ensure high reliability.

When a round wire is wounded as a coil wire, like the prior art, the strength and rigidity of the wire are relatively high, and the above problems hardly occur. As for a coil wounded with a foil-like conductor, the wire itself readily deforms and is damaged. The above problems cause an insulation failure. From this, demands have strongly arisen for a foil coil structure which can be securely assembled into a linear motor housing with high yield.

SUMMARY OF THE INVENTION

The present invention has been proposed to solve the conventional problems, and has as its object to provide an exposure apparatus and a linear motor suitable for the same that can increase coil fixing/positioning precision, workability in assembling a coil into a linear motor housing, exposure speed, and reliability.

To achieve the above object, a linear motor according to the present invention provides a core member; a coil obtained by winding a foil-like conductor having an insulating layer around the core member in a multilayered structure; and a coil fixing portion fixing the coil, wherein the coil is fixed to the coil fixing portion by using the core member.

In the linear motor according to the present invention, the core member is preferably formed from an insulating material.

In the linear motor according to the present invention, the core member is preferably formed from a material having a low thermal conductivity.

In the linear motor according to the present invention, the core member is preferably formed from the same material as a material of the coil fixing portion or a material having substantially the same linear expansion coefficient.

In the linear motor according to the present invention, the core member is preferably formed from a ceramic.

In the linear motor according to the present invention, the core member is preferably formed from a resin material.

In the linear motor according to the present invention, the core member is preferably annular and is fixed by being fitted on the coil fixing portion.

In the linear motor according to the present invention, preferably an outer circumferential surface of the coil wounded with the foil-like conductor in the multilayered structure is covered with an electrically insulating material.

In the linear motor according to the present invention, the coil fixing portion is preferably shaped such that an area in a direction in which a large force is received under influence of a magnetic field is larger than an area in a direction in which a small force is received.

In the linear motor according to the present invention, preferably, the core member also serves as a winding jig used to form a coil.

To achieve the above object, a method of manufacturing a linear motor according to the present invention comprises a step of causing a core member of the linear motor to serve as a winding jig and winding a foil-like conductor around the core member; and a step of manufacturing the linear motor by using the core member as part of a coil after the winding step, wherein the linear motor includes a core member, a coil obtained by winding the foil-like conductor having an insulating layer around the core member in a multilayered structure, and a coil fixing portion fixing the coil, and the coil is fixed to the coil fixing portion by using the core member.

An exposure apparatus according to the present invention comprises a reticle stage scanning a reticle; a wafer stage scanning a wafer; a projection optical system arranged so that the reticle scanned is projected on the wafer scanned via the optical unit; and a linear motor being used in the apparatus having, (i) a core member, (ii) a coil obtained by winding a foil-like conductor having an insulating layer around the core member in a multilayered structure; and (iii) a coil fixing portion fixing the coil, wherein the coil is fixed to the coil fixing portion by using the core member.

In the exposure apparatus according to the present invention, the linear motor is preferably used as at least either one of a force actuator in a driving unit driving the reticle stage and the wafer stage or in a reaction force receiving unit for cutting off transmission of a reaction force in driving the stage, and means for preventing vibration transmission in a support unit for the wafer stage and a support unit for the optical unit.

In the exposure apparatus according to the present invention, a beam used preferably includes a light ray and an electron beam emitted via a projection optical system.

A semiconductor device manufacturing method according to the present invention comprises the steps of: installing a plurality of semiconductor manufacturing apparatuses including an exposure apparatus in a semiconductor manufacturing factory; and manufacturing a semiconductor device by using the plurality of semiconductor manufacturing apparatuses, wherein the exposure apparatus includes a reticle stage scanning a reticle; a wafer stage scanning a wafer; a projection optical system arranged so that the reticle scanned is projected on the wafer scanned via the optical unit; and a linear motor being used in the apparatus having, (i) a core member, (ii) a coil obtained by winding a foil-like conductor having an insulating layer around the core member in a multilayered structure; and (iii) a coil fixing portion fixing the coil, wherein the coil is fixed to the coil fixing portion by using the core member.

The semiconductor device manufacturing method according to the present invention, further comprises the steps of: connecting the plurality of semiconductor manufacturing apparatuses via a local area network; connecting the local area network to an external network outside the semiconductor manufacturing factory; acquiring information about the exposure apparatus from a database on the external network by using the local area network and the external network; and controlling the exposure apparatus on the basis of the acquired information.

In the semiconductor device manufacturing method according to the present invention, a database provided by a vendor or user of the exposure apparatus is preferably accessed via the external network, thereby obtaining maintenance information of the exposure apparatus by data communication, or data communication is performed between the semiconductor manufacturing factory and another semiconductor manufacturing factory via the external network, thereby performing production management.

A semiconductor manufacturing factory according to the present invention comprises a plurality of semiconductor manufacturing apparatuses including an exposure apparatus; a local area network connecting the plurality of semiconductor manufacturing apparatuses; and a gateway for allowing access to an external network outside the factory from the local area network and allowing communicating information about at least one of the plurality of semiconductor manufacturing apparatuses, wherein the exposure apparatus includes a reticle stage scanning a reticle; a wafer stage scanning a wafer; a projection optical system arranged so that the reticle scanned is projected on the wafer scanned via the optical unit; and a linear motor being used in the apparatus having, (i) a core member, (ii) a coil obtained by winding a foil-like conductor having an insulating layer around the core member in a multilayered structure; and (iii) a coil fixing portion fixing the coil, wherein the coil is fixed to the coil fixing portion by using the core member.

A maintenance method for an exposure apparatus according to the present invention comprises the steps of: preparing a database for accumulating information about maintenance of the exposure apparatus on an external network outside a factory in which an exposure apparatus is installed; connecting the exposure apparatus to a local area network in the factory; and maintaining the exposure apparatus on the basis of information accumulated in the database by using the external network and the local area network, wherein the exposure apparatus includes a reticle stage scanning a reticle; a wafer stage scanning a wafer; a projection optical system arranged so that the reticle scanned is projected on the wafer scanned via the optical unit; and a linear motor being used in the apparatus having, (i) a core member, (ii) a coil obtained by winding a foil-like conductor having an insulating layer around the core member in a multilayered structure; and (iii) a coil fixing portion fixing the coil, wherein the coil is fixed to the coil fixing portion by using the core member.

Preferably, the exposure apparatus according to the present invention further comprises a display for displaying maintenance information, a network interface connected to a computer network to communicate the maintenance information, and a computer for executing the communication by network software, and the display, the network interface, and the computer enable communicating maintenance information of the exposure apparatus via a computer network.

In the exposure apparatus according to the present invention, the network software preferably provides on the display the user interface for accessing a maintenance database provided by a vendor or user of the exposure apparatus and connected to the external network outside a factory in which the exposure apparatus is installed, and information is obtained from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A and 1B are views showing a core-attached foil coil and a fixing method therefor according to the first embodiment of the present invention, in which FIG. 1A is a plan view, and FIG. 1B is a sectional view;

FIGS. 2A and 2B are views showing an example of a linear motor according to the first embodiment of the present invention, in which FIG. 2A is a plan view, and FIG. 2B is a sectional view taken along the line A—A;

FIGS. 6A, 6B, and 6C are views showing in detail an example of the core-attached foil coil according to the first embodiment of the present invention, in which FIG. 6A is a plan view, FIG. 6B is a sectional view, and FIG. 6C is a sectional view taken along the line D—D in FIG. 6A;

FIGS. 9A to 9E are views showing an example of the core-attached foil coil according to the second embodiment of the present invention, in which FIG. 9A is a plan view, FIG. 9B is a sectional view, FIG. 9C is a sectional view taken along the line E—E in FIG. 9A, FIG. 9D is a plan view, and FIG. 9E is a cross-sectional view;

FIGS. 10A to 10E are views showing another example of the core-attached foil coil according to the second embodiment of the present invention, in which FIG. 10A is a plan view, FIG. 10B is a sectional view, FIG. 10C is a sectional view taken along the line F—F in FIG. 10A, FIG. 10D is a plan view, and FIG. 10E is a cross-sectional view;

FIGS. 12A and 12B are views showing an example of a single-phase linear motor according to the third embodiment to which the present invention is applied, in which FIG. 12A is a plan view, and FIG. 12B is a front view;

FIGS. 15A and 15B are views showing an example of a linear motor used in a conventional exposure apparatus, in which FIG. 15A is a plan view, and FIG. 15B is a sectional view taken along the line G—G;

FIGS. 17A and 17B are views schematically showing a coil used in a conventional exposure apparatus and a coil fixing method, in which FIG. 17A is a plan view, and FIG. 17B is a sectional view;

FIG. 20 is a view showing an example of a user interface;

DETAILED DESCRIPTION OF THE PREFERRED EMBODIMENTS

Preferred embodiments of the present invention will now be described in detail in accordance with the accompanying drawings.

<First Embodiment>

Figure 1A:
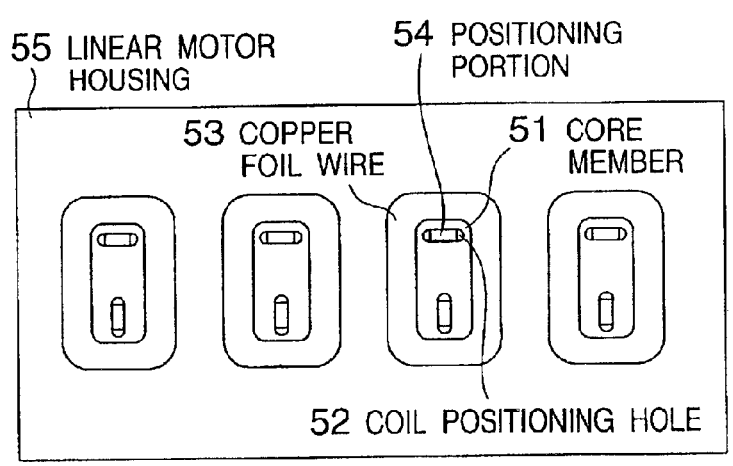
Figure 1B:
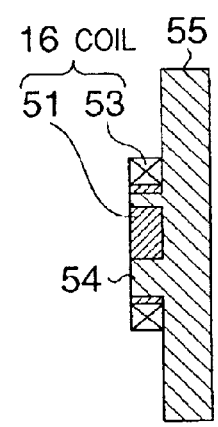

FIGS. 1A and 1B are views for explaining the main part of a linear motor according to the first embodiment of the present invention. FIG. 1A is a plan view, and FIG. 1B is a cross-sectional view. FIGS. 1A and 1B schematically show a coil 16 and a method of fixing the coil 16 according to the first embodiment. The coil 16 is made up of two parts: a copper foil wire 53 and insulating core member 51. The core member 51 has coil positioning holes 52. A linear motor housing 55 has positioning portions 54 serving as coil fixing portions. The positioning portions 54 project from the linear motor housing 55. The positioning portions 54 are fitted in the coil positioning holes 52 of the coil 16, and the coil 16 is fixed by an adhesive means or the like. The coil 16 is accurately positioned and fixed to the linear motor housing 55. This also applies to YL and YR linear motors 12 and 13.

In FIG. 1A, the coil positioning holes 52 are a hole extending in the lateral direction of FIG. 1A, and a hole extending in the longitudinal direction of FIG. 1A. The positioning portions 54 are a projection extending in the lateral direction of FIG. 1A, and a projection extending in the longitudinal direction of FIG. 1A. By fitting the coil positioning holes 52 and positioning portions 54, the position of the coil 16 is regulated to the linear motor housing 55. That is, the coil positioning hole 52 and the projection of the positioning portion 54 that extend in the lateral direction of FIG. 1A position the coil 16 in the longitudinal direction of FIG. 1A with respect to the linear motor housing 55. The coil positioning hole 52 and the projection of the positioning portion 54 that extend in the longitudinal direction of FIG. 1A position the coil 16 in the lateral direction of FIG. 1A with respect to the linear motor housing 55. A method of fixing the coil 16 is not limited to the shapes of the coil positioning hole 52 and positioning portion 54, and the position of the coil 16 suffices to be regulated at least within the plane of FIG. 1A with respect to the linear motor housing 55.

Figure 3:
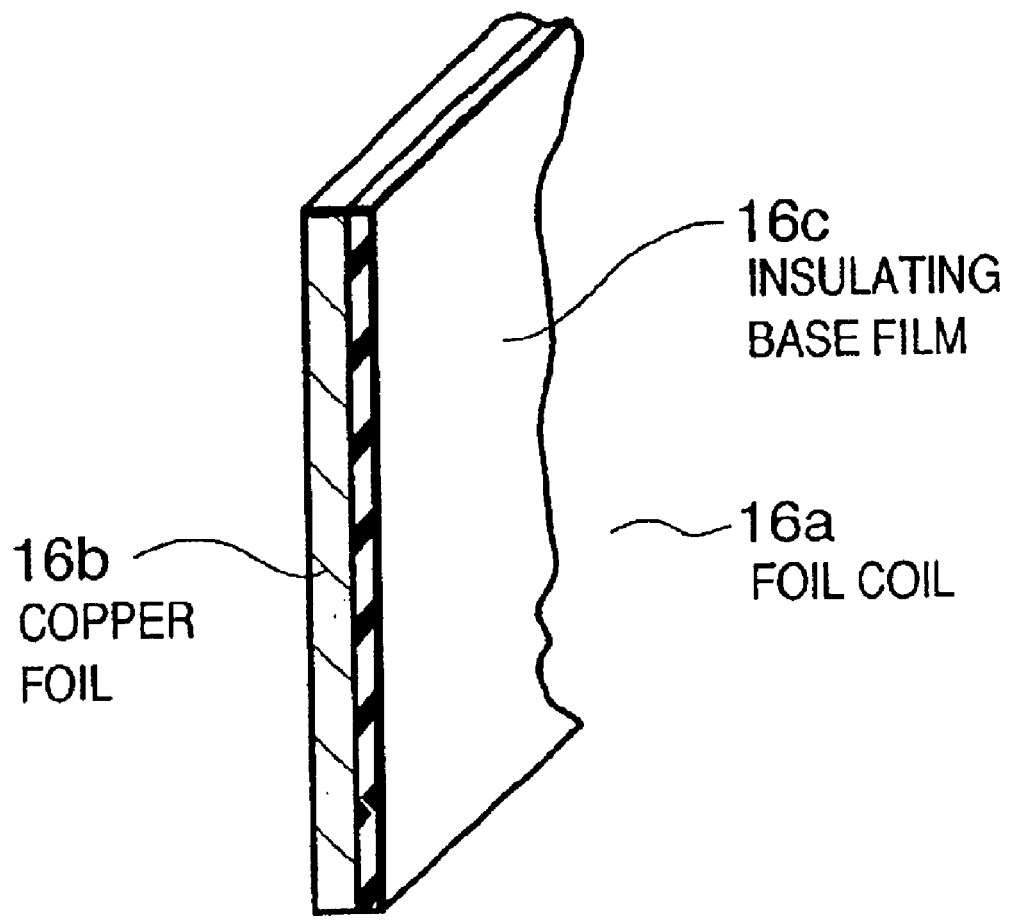
FIG. 3 is a perspective view showing in detail an example of a copper foil wire according to the first embodiment of the present invention.

FIG. 3 shows a foil coil as a coil wire used for the coil of the linear motor according to the first embodiment of the present invention. A foil coil 16a is formed such that a copper foil 16b having a foil-like section and a thickness of about several $\mu$m to several ten $\mu$m is deposited on or joined to one surface of an insulating base film 16c having a thickness of several $\mu$m.

Figure 2A:
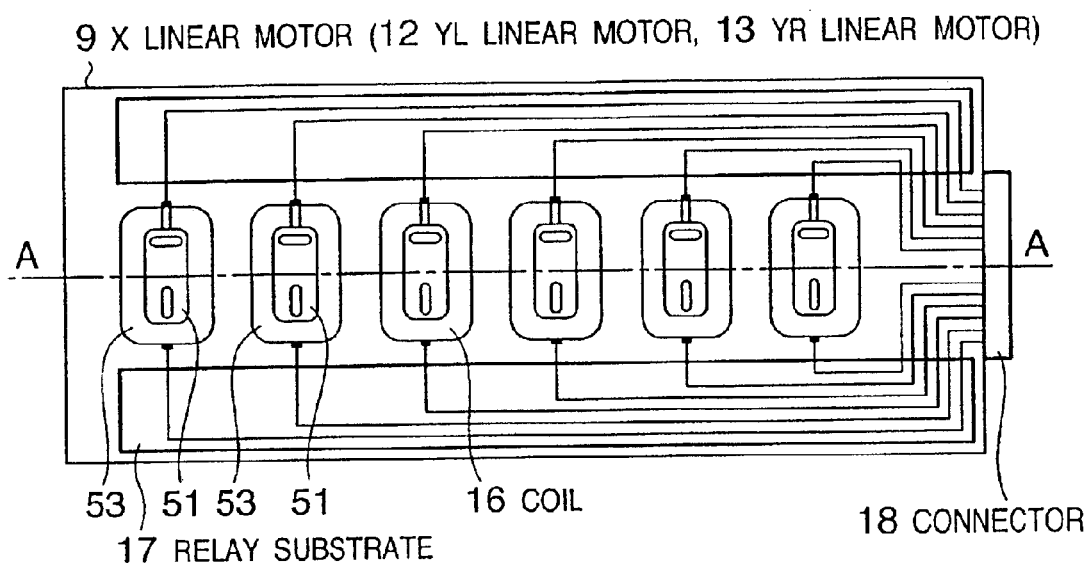
Figure 2B:
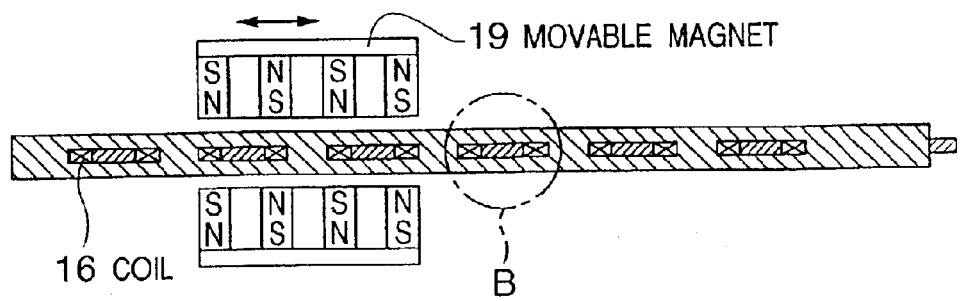
Figure 4:
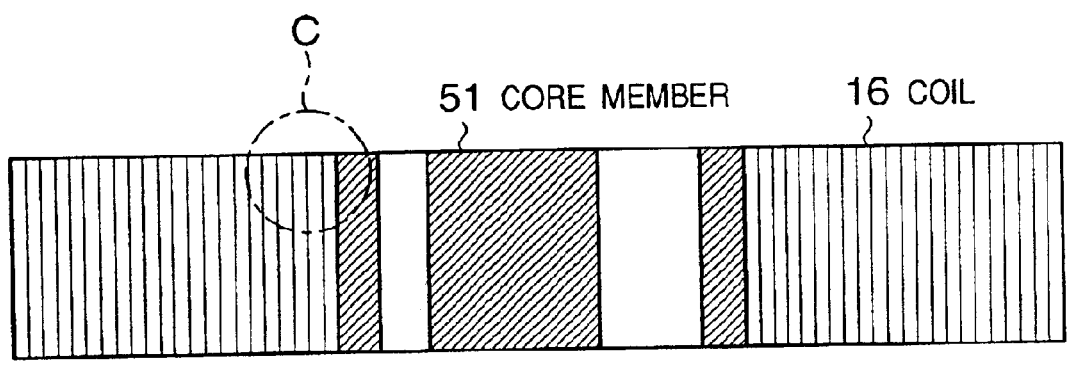
FIG. 4 is an enlarged sectional view of a circuit B portion in FIG. 2B showing a coil according to the first embodiment of the present invention.

FIG. 4 is an enlarged sectional view showing a portion B in FIG. 2B when the foil coil 16a is wounded. The coil 16 is formed by winding the foil coil 16a around the core member 51 in a multilayered structure so as to obtain a hollow coil.

Figure 5:
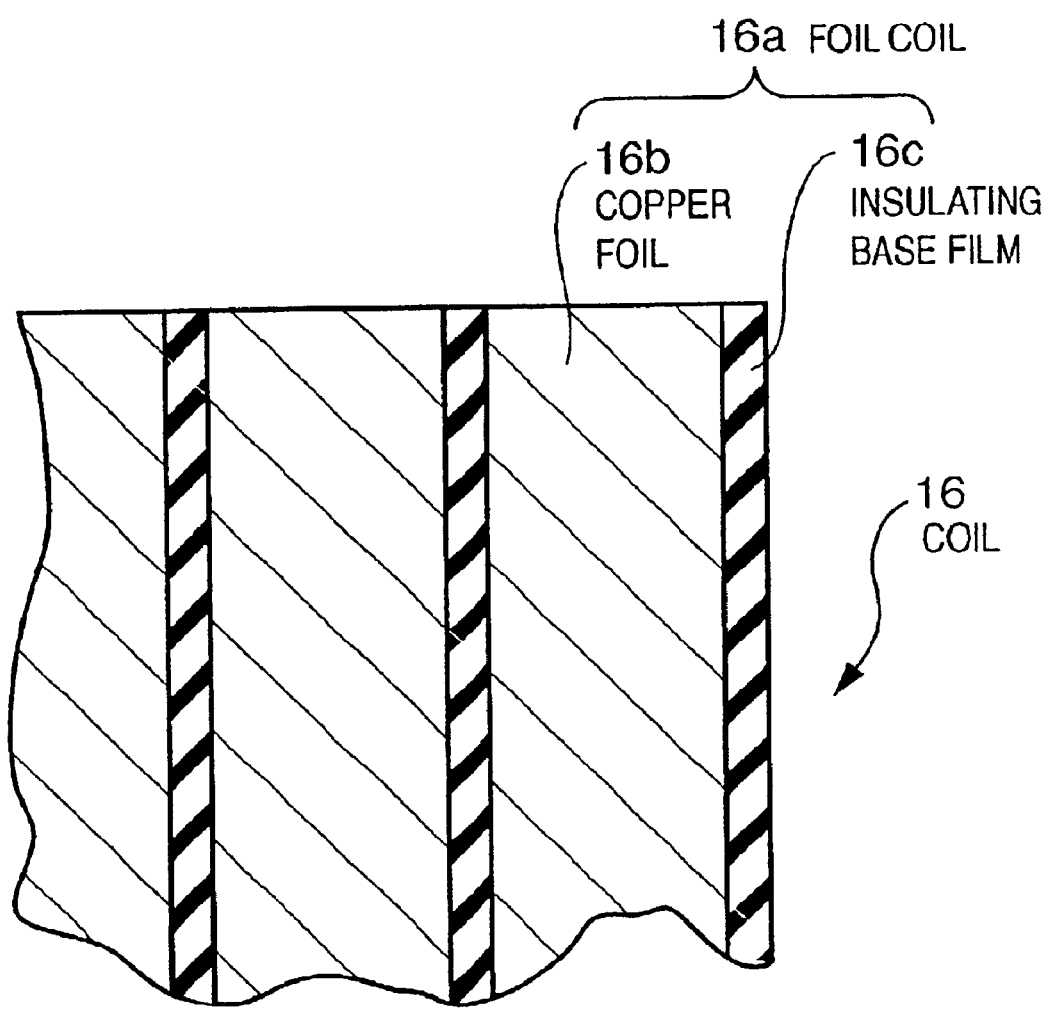
FIG. 5 is an enlarged sectional view of a circuit C portion in FIG. 4 showing the coil according to the first embodiment of the present invention.

FIG. 5 is an enlarged sectional view showing a portion C of the coil 16 in FIG. 4. The foil coil 16a is continuously wounded in a multilayered aligned state to form the coil 16. The copper foil 16b and insulating base film 16c of the foil coil 16a are alternately stacked, which prevents conduction between adjacent layers of the copper foil 16b.

Figure 6A:
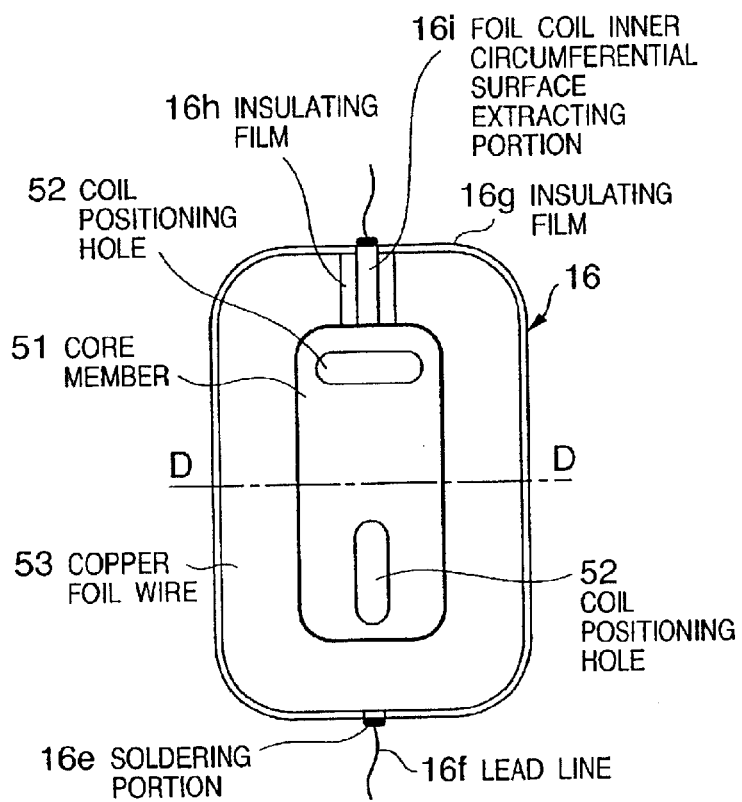
Figure 6B:
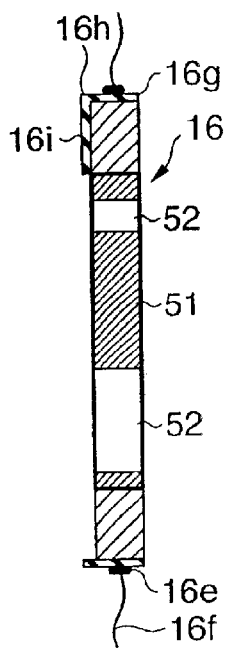
Figure 6C:
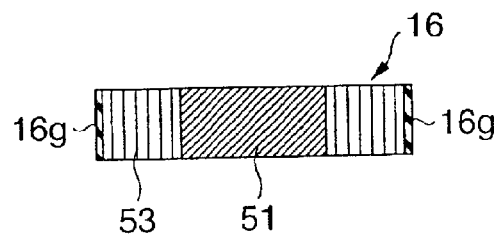

FIGS. 6A to 6C are views showing the overall structure of the foil coil in detail. FIG. 6A is a plan view, FIG. 6B is a side view, and FIG. 6C is a sectional view taken along the like D—D in FIG. 6A. The core member 51 is made of a ceramic, resin, or the like. The coil positioning holes 52 are formed in the core member 51 with high precision so as to position and fix the coil 16 to the linear motor housing 55 with high precision.

Figure 17A:
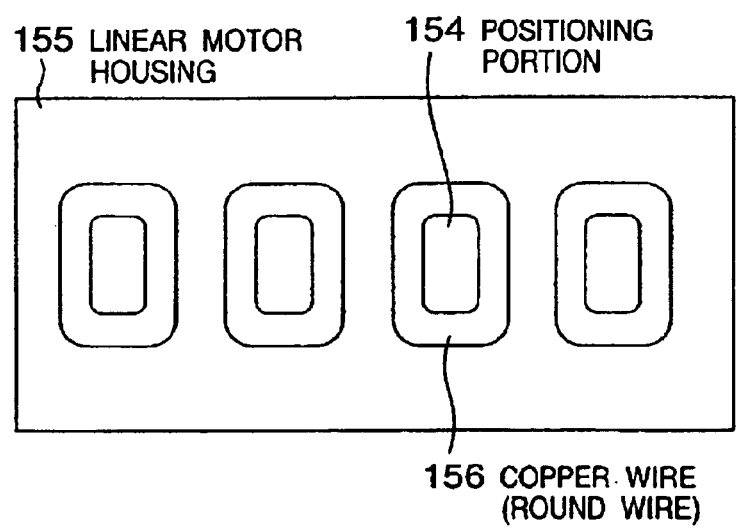
Figure 17B:
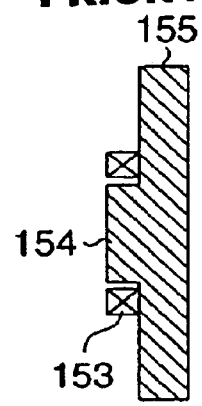

This can remarkably increase the positioning/fixing precision, compared to a structure in which a coil copper wire 156 is fitted on a positioning portion 154, like a conventional coil shown in FIGS. 17A and 17B. The coil positioning hole 52 used to position the coil is formed in the core member 51 made of a ceramic or the like, and can be processed with high dimensional precision.

In the prior art, the wire may be damaged in inserting the coil into the positioning portion 154 because the wire rubs against the positioning portion 154. To the contrary, the structure of the first embodiment does not damage the coil wire because the coil positioning hole of the core member 51 made of a ceramic or the like rubs against the positioning portion 54.

As for a conventional foil coil, the copper foil is exposed on the inner coil surface, so the inner circumferential surface must be electrically insulated by an insulating film or the like. In this embodiment, the core member 51 made of an insulating material can electrically insulate the copper foil wire 53.

In FIG. 6, reference numeral 16e denotes a soldering portion extracted from the outer circumferential surface of the multilayered coil for soldering; 16f, a lead line extending to a relay substrate 17 in FIG. 2A; 16g, an insulating film for covering the outer circumferential surface of the copper foil wire 53; and 16h, an insulating film for insulating the copper foil wire 53 from a foil coil inner circumferential surface extracting portion 16i for extracting the inner circumferential surface of the multilayered coil to the outside. The foil coil inner circumferential surface extracting portion 16i may be extracted outside as a copper foil or as a lead line.

The core member 51 is in tight contact with the copper foil wire 53. Heat generated by the coil 16 in coil energization easily escapes to the linear motor housing 55 via the core member 51. If a temperature rise of the linear motor housing 55 is permitted to a certain degree, heat generated by the coil 16 can be efficiently removed outside by forming the core member 51 from a high-thermal-conductivity material.

In a high-precision apparatus such as an exposure apparatus in which the allowable temperature change of a positioning target is 0.1° C. or less, too much temperature rise of the linear motor housing 55 must be prevented. For this purpose, the core member 51 adopts a low-thermal-conductivity material so as not to transmit heat to the linear motor housing 55 in assembling the linear motor into the exposure apparatus. The coil itself is covered with a jacket (not shown), and the interior of the jacket is directly cooled with an inert coolant, pure water, or forced air.

A temperature rise of the core member 51 by heat generation of the coil 16 thermally deforms the core member 51 in correspondence with the linear expansion coefficient. This thermal deformation changes the relative positional relationship between the coil 16 and the linear motor housing 55. The thermal deformation behaviors of the core member 51 and positioning portion 54 are the same as far as they have almost the same linear expansion coefficient or are made of the same material with the same linear expansion coefficient. Thus, the change in relative positional relationship can be reduced. In view of these facts, the first embodiment forms the core member 51 from a ceramic which is the same material as that of the linear motor housing 55. Of ceramics, one having a low thermal conductivity is adopted to suppress any temperature rise of the linear motor housing 55. The "linear expansion coefficients are almost the same" means that one linear expansion coefficient is equal to the other one within ±10%.

Figure 7:
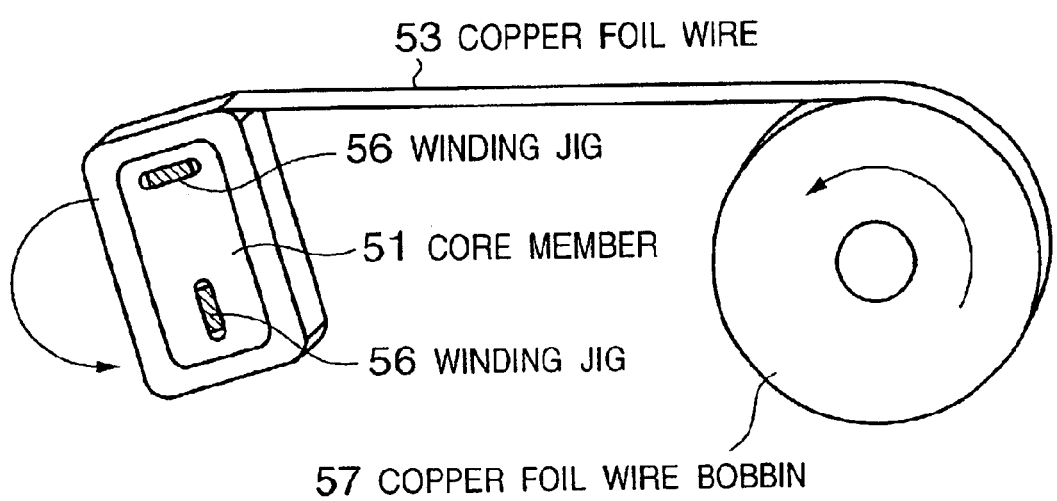
FIG. 7 is a schematic sectional view showing an example of the core-attached foil coil winding step according to the first embodiment of the present invention.

FIG. 7 is a view for explaining a method of forming the coil 16 according to the present invention. The core member 51 of the present invention is not only used for positioning a coil but also used in the step of forming a coil, i.e., winding the copper foil wire 53 so as to share parts. More specifically, the core member 51 is set on winding jigs corresponding to the coil positioning holes 52, and a coil is formed through the winding step. The prior art requires the removal step after the winding step of winding a part equivalent to the core member 51. In the present invention, the core member 51 also serves as a winding jig, and after the foil coil 16a is wound around the core member 51, the core member 51 is directly used as part of the coil and fitted on the positioning portions 54 of the linear motor housing 55. Thus, the present invention can eliminate the removal step of removing the coil from the jig. Since the removal step for the winding jig is eliminated, such removal does not decrease the precision of the inner coil surface serving as a positioning portion or damage the wire. With the core member 51 also serving as a jig for winding a coil, like the present invention, the manufacturing cost of the coil 16 can be decreased while high dimensional precision is kept.

FIGS. 2A and 2B show a linear motor using the copper foil coil structure and fixing method described above. A plurality of coils 16 are positioned and aligned within an effective stroke in the driving direction of an X linear motor 9. The lead line of each coil 16 is connected to the relay substrate 17 bearing the extraction pattern of each coil, and to a connector 18 via the relay substrate 17. The relay substrate 17 may be mounted on a linear motor stationary member. The movable member incorporates movable magnets 19 magnetized as shown in FIG. 2B so as to face the linear motor stationary member. By flowing a driving current through the coils 16, the movable magnets 19 magnetized by a Lorentz force as shown in FIG. 2B are moved in a moving direction indicated by the arrow, thereby moving the movable member.

Figure 13:
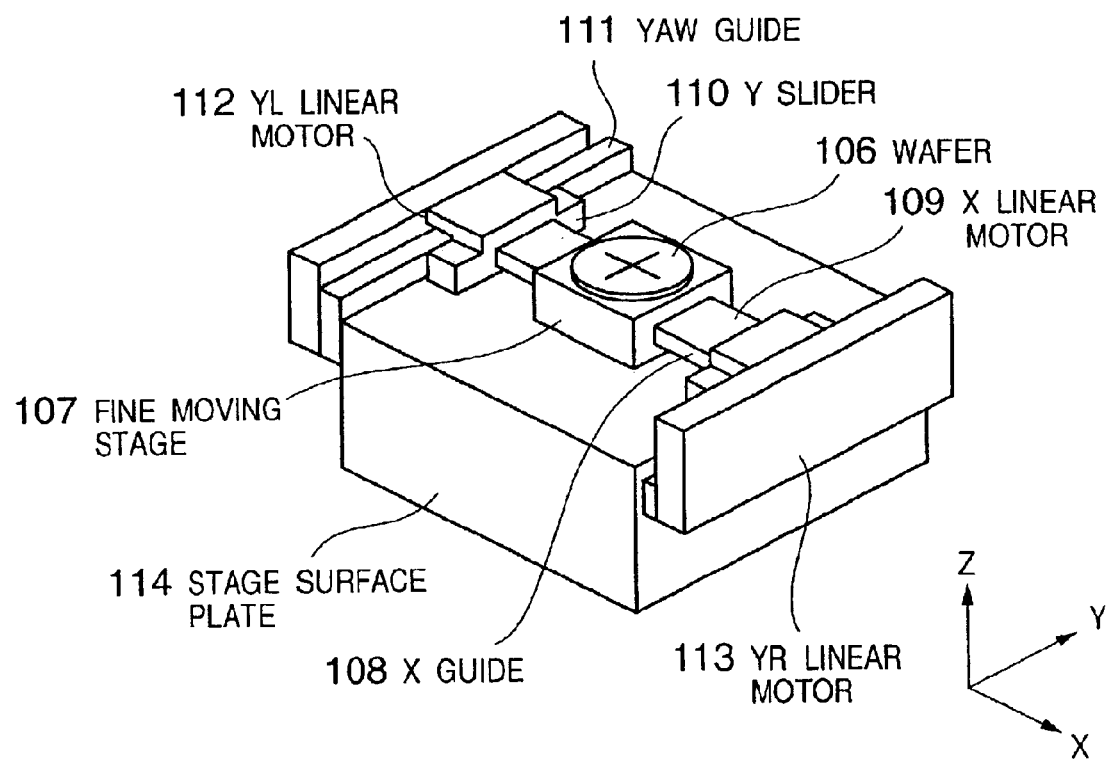
FIG. 13 is a perspective view showing an example of a positioning stage used in an exposure apparatus.
Figure 14:
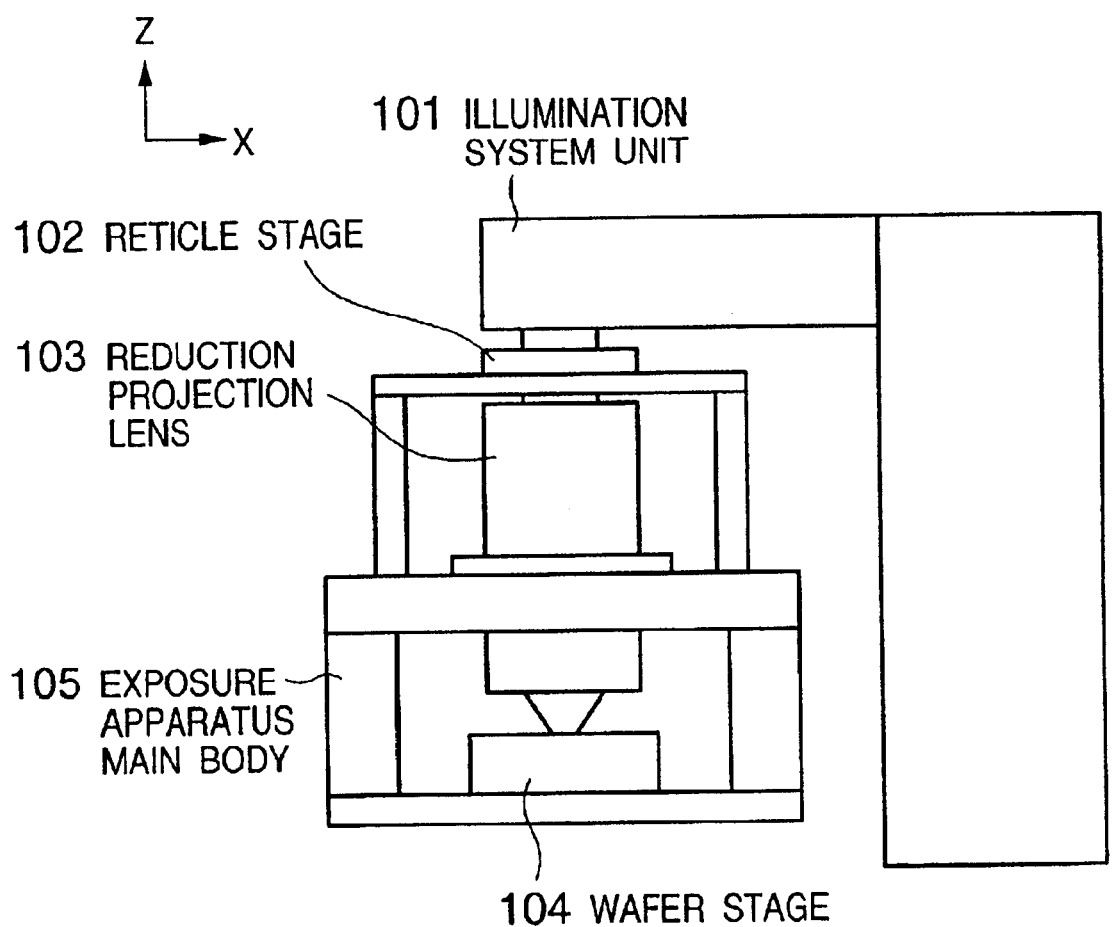
FIG. 14 is a view showing a whole structure of the exposure apparatus.
Figure 15A:
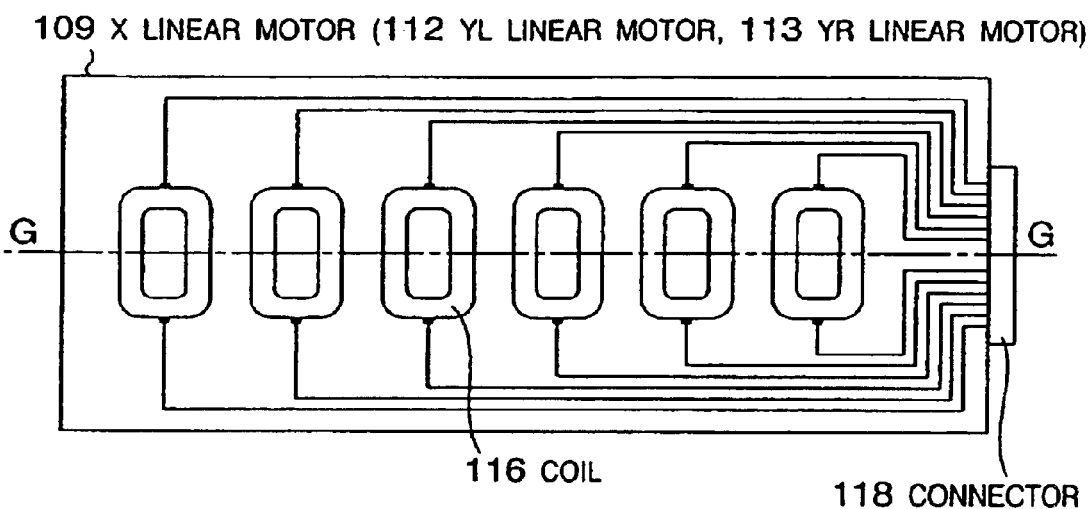
Figure 15B:
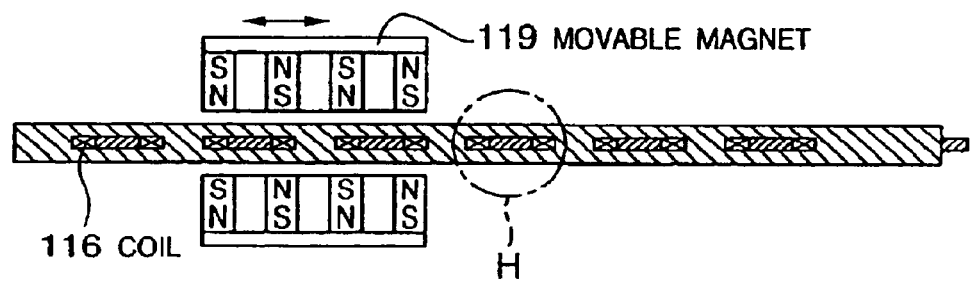
Figure 16:
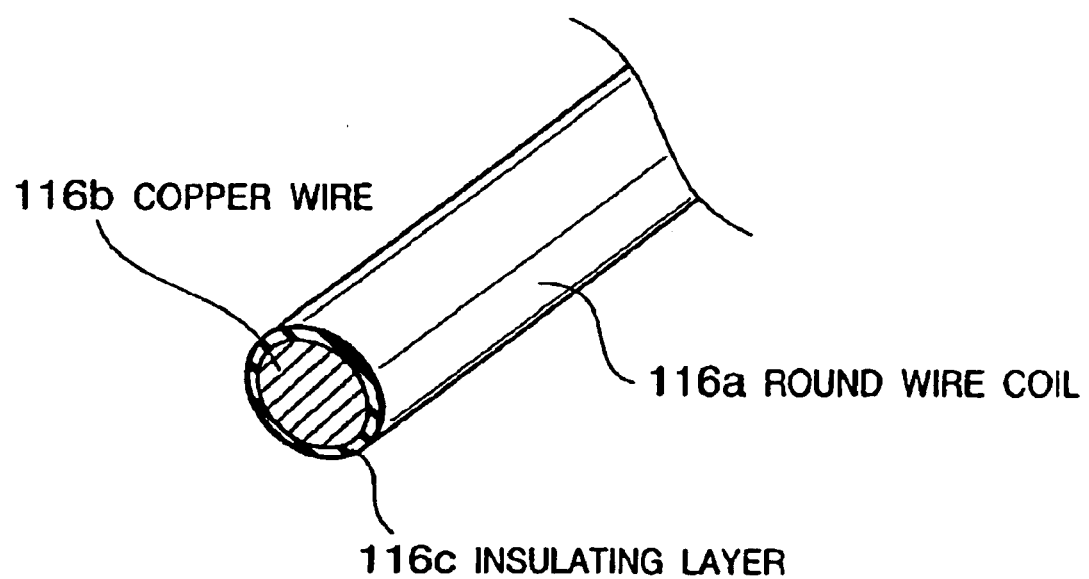
FIG. 16 is a perspective view showing an example of a coil wire used in the conventional exposure apparatus.

A stage as shown in FIG. 13 and an exposure apparatus as shown in FIG. 14 are constituted by using this linear motor. In FIG. 14, reference numeral 101 denotes an illumination system unit having an exposure light source and a function of shaping exposure light and irradiating a reticle; 102, a reticle stage which supports a reticle serving as an exposure pattern master and scans the reticle with respect to a wafer at a predetermined reduction exposure magnification to the wafer; 103, a reduction projection lens for reducing and projecting a master pattern onto a wafer (substrate); 104, a wafer stage for sequentially moving a substrate (wafer) every exposure; and 105, an exposure apparatus main body which supports the reticle stage 102, projection lens 103, and wafer stage 104.

In FIG. 13, reference numeral 106 denotes a wafer with a single-crystal silicon substrate surface coated with a resist in order to project and transfer a reticle pattern drawn on a reticle substrate via a reduction exposure system; 107, a fine moving stage for finely adjusting the wafer in the optical axis and tilt directions of the reduction exposure system and in a rotational direction around the optical axis; 108, an X guide for guiding movement of the fine moving stage 107 in the X-axis direction; 109, an X linear motor for moving and driving the fine moving stage in the X direction; 110, a Y slider for moving and guiding the X guide 108 and fine moving stage 107 in the Y direction; 111, a yaw guide for guiding the Y slider 110 in the Y direction; 112, a YL linear motor for moving and guiding the Y slider 110 in the Y direction; 113, a YR linear motor; and 114, a stage surface plate for floating the fine moving stage 107 and Y slider 110 by hydrostatic pads attached to their lower surfaces, and vertically supporting and guiding them.

<Second Embodiment>

Figure 8A:
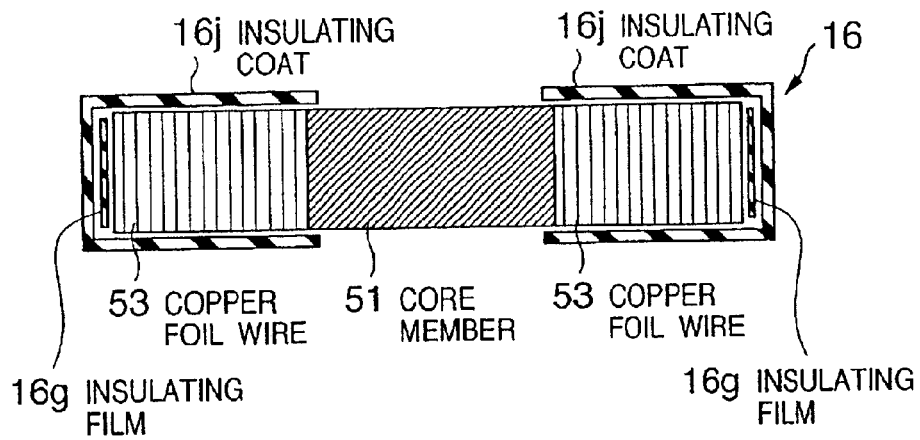
FIGS. 8A, 8B, and 8C are sectional views showing examples of insulation processing for a core-attached foil coil according to the second embodiment of the present invention.
Figure 8B:
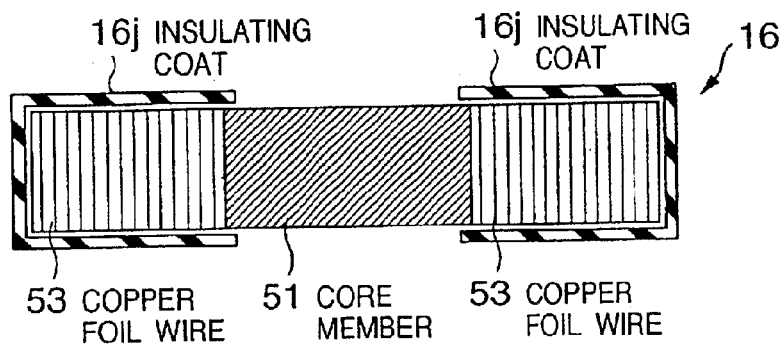
Figure 8C:
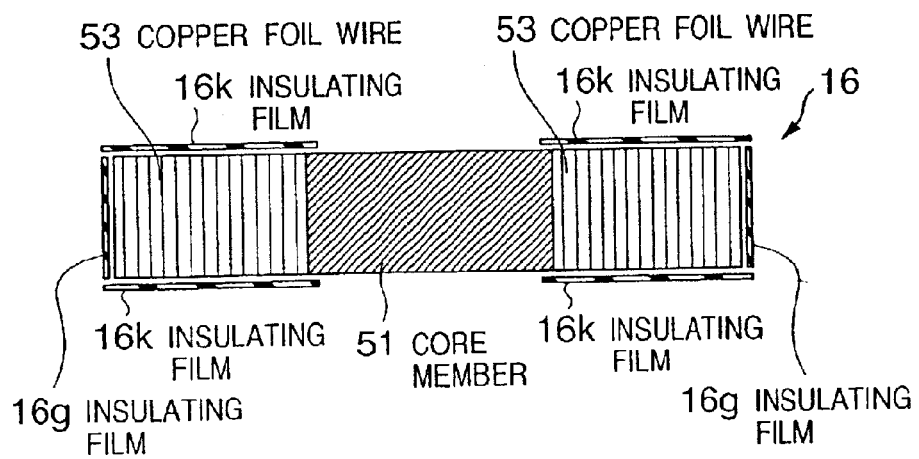

FIGS. 8A, 8B, and 8C show the second embodiment of the present invention. FIGS. 8A, 8B, and 8C show modifications of an insulation method for a core-attached foil coil. Electrical insulation of the entire exposed portion of a coil 16 is compensated for by applying an insulating film 16g such as a polyurethane resin or epoxy resin so as to cover the outer circumferential surface of the coil 16, as shown in FIG. 8A. With a core member 51 as shown in FIG. 8A, the inner circumferential surface need not be insulated. An insulating coat 16j can be applied to part of the core member 51, which solves the insulation problem of a coil edge where a coating material is difficult to apply.

As shown in FIG. 8B, the coil 16 can be directly covered with the insulating coat 16j without forming any insulating film or the like on the outer circumferential surface of the coil. Also in this case, similar to the case shown in FIG. 8A, the presence of the core member 51 facilitates insulation processing in comparison with the prior art.

As shown in FIG. 8C, the insulating film 16g and an insulating film 16k may be attached to or wound around the outer circumferential surface of the coil and the entire exposed portions of the upper and lower surfaces such that the entire exposed portion of the coil 16 is covered to compensate for electrical insulation. In this case, part of the core member 51 serves as a margin for the insulating film 16k, which greatly facilitates fixing of the film in comparison with the prior art.

Since the present invention can adhere an insulating coat and film by using the core member, a foil coil can be insulated with low cost and high reliability.

FIGS. 9A to 9E and 10A to 10E show modifications of the embodiment in which the shape of the core member 51 is changed. FIG. 9A shows a case wherein the core member 51 is annular like a doughnut along the inner circumferential surface of the coil and can be fitted on and fixed to a positioning portion 54.

A core-attached foil coil can be positioned and fixed to a linear motor housing 55 by slightly changing the size of the positioning portion 54, compared to the prior art. The shape of the core member 51 is formed by resin molding because formation by cutting processing generally increases the number of steps. This can reduce the cost of the core member 51 and increase the fixing precision in comparison with the prior art.

Accordingly, the fixing precision and reliability of the coil 16 can be increased while the design of the linear motor housing 55 is hardly changed. The positioning precision of a precise positioning linear motor and the exposure precision of an exposure apparatus can be increased.

Figure 10A:
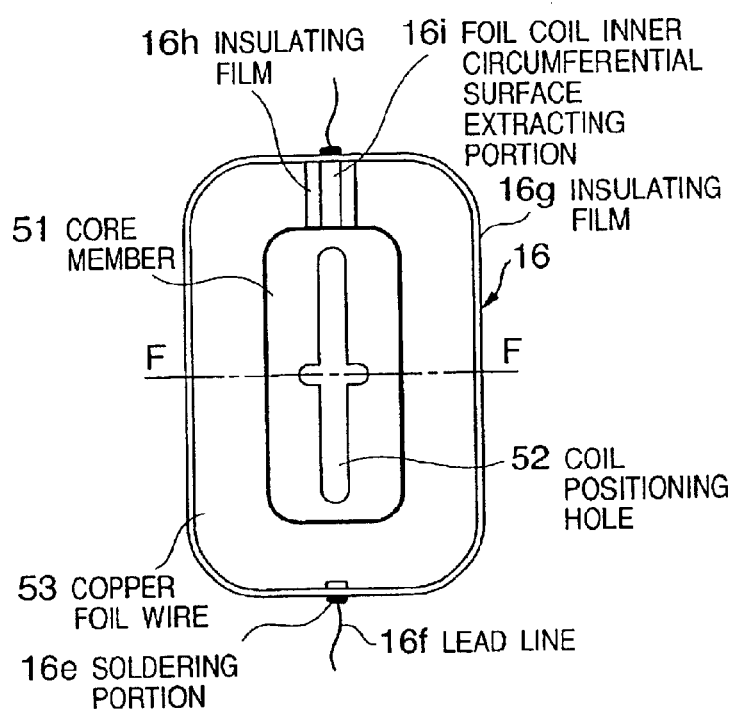
Figure 10B:
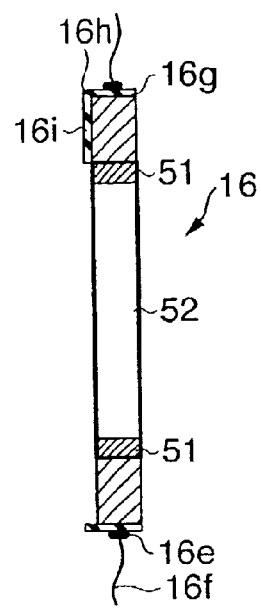
Figure 10C:
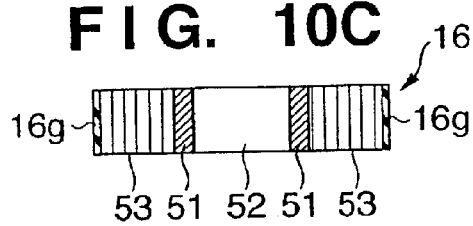
Figure 10D:
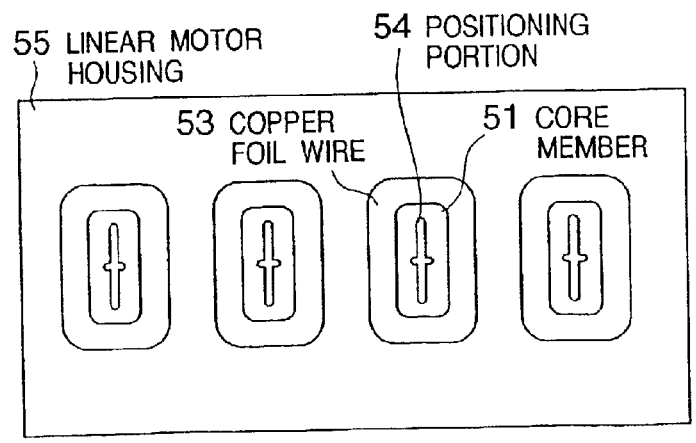
Figure 10E:
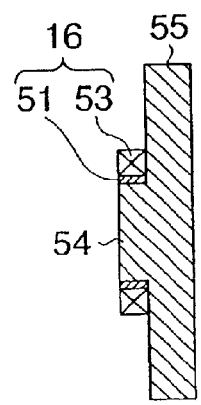

FIGS. 10A to 10C show a case wherein the positioning hole 52 of the core member 51 shown in FIGS. 6A to 6C is designed into a suitable shape for the linear motor and exposure apparatus. In the coil of this embodiment, the long side of the coil 16 (longitudinal direction of the coil 16 in FIG. 10A) receives a force in the lateral direction of FIG. 10A under the influence of a magnetic field, and hardly receives a force in the longitudinal direction. In fixing the coil 16, the lateral force is sufficiently received by the positioning portion 54, and longitudinal fixing is merely positioning. To this end, the core member 51 has a shape as shown in FIGS. 10A to 10C.

A cross-shaped coil positioning hole 52 is formed in the core member 51 so as to increase the contact area of the longitudinal plane of FIG. 10A between the core member 51 and the positioning portion 54 fitted in the hole 52, i.e., the contact area of the plane which receives a lateral force. The angle of the core member 51, i.e., a radius R of the core shape is set larger than in FIG. 6A. This is because if the R portion is small, a winding stress readily stays in the R portion of a copper foil wire 53, causing a winding distortion. This generates an insulation failure to decrease the yield, and increases the gap between adjacent layers of the copper foil wire 53. As a result, the coil wire moment and linear motor efficiency decrease. To prevent this, the radius R is set large.

This core-attached foil coil may be applied to a linear motor as shown in FIGS. 2A and 2b.

<Third Embodiment>

Figure 11:
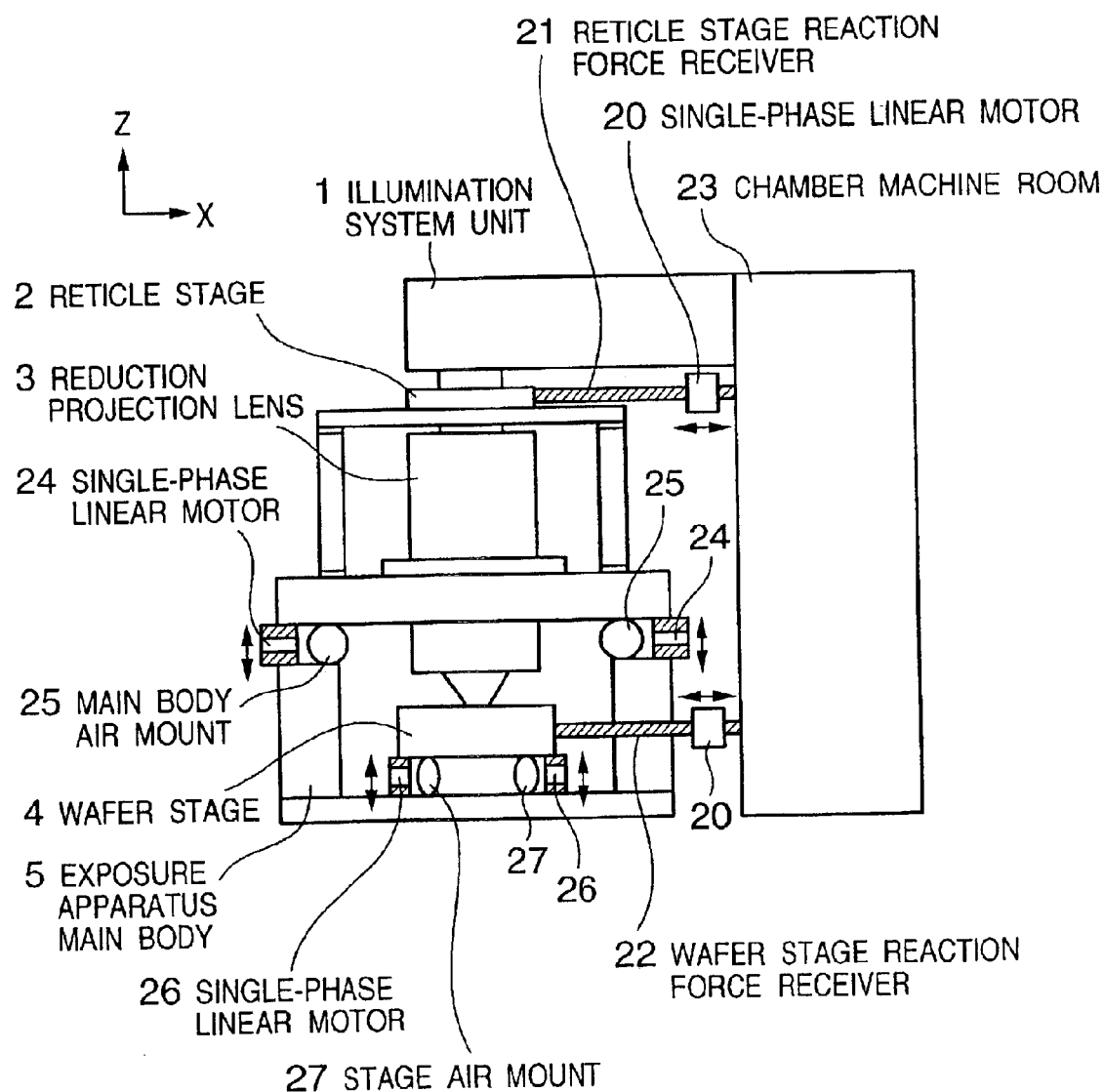
FIG. 11 is a schematic view showing an overall exposure apparatus according to the third embodiment to which the present invention is applied.

FIG. 11 shows the third embodiment of the present invention. In FIG. 11, reference numeral 1 denotes an illumination system unit having an exposure light source and a function of shaping exposure light and irradiating a reticle; 2, a reticle stage which supports a reticle serving as an exposure pattern master and scans the reticle with respect to a wafer at a predetermined reduction exposure magnification to the wafer; 3, a reduction projection lens for reducing and projecting a master pattern onto a wafer (substrate); 4, a wafer stage for sequentially moving a substrate (wafer) every exposure; and 5, an exposure apparatus main body which supports the reticle stage 2, projection lens 3, and wafer stage 4.

A linear motor reaction force in scan of the reticle stage 2 is transmitted to a chamber machine room 23 via a reticle stage reaction force receiver 21 so as not to transmit the reaction force to the exposure apparatus main body 5. A single-phase linear motor 20 is disposed at the middle of the reticle stage reaction force receiver 21 in order to mechanically separate the exposure apparatus main body 5 and chamber machine room 23 and to cut off transmission of vibrations. The single-phase linear motor 20 functions as a force actuator, causes only a reaction force component to escape to the chamber machine room 23, and prevents a decrease in exposure precision caused by the reaction force transmitted to the exposure apparatus main body 5.

A linear motor reaction force in scan of the wafer stage 4 is transmitted to the chamber machine room 23 via a wafer stage reaction force receiver 22 so as not to transmit the reaction force to the exposure apparatus main body 5. A single-phase linear motor 20 is disposed at the middle of the wafer stage reaction force receiver 22 in order to mechanically separate the exposure apparatus main body 5 and chamber machine room 23 and to cut off transmission of vibrations. The single-phase linear motor 20 functions as a force actuator, causes only a reaction force component to escape to the chamber machine room 23, and prevents a decrease in exposure precision caused by the reaction force transmitted to the exposure apparatus main body 5.

In the exposure apparatus main body 5, the upper side which supports the reduction projection lens 3 is separated from floor vibrations (external vibrations) and the reaction force of the wafer stage 4. For this purpose, single-phase linear motors 24 are arranged parallel to main body air mounts 25 in order to improve a damping characteristic against a high frequency component when the reduction projection lens 3 is supported via the main body air mounts 25. The single-phase linear motors 24 prevent transmission of vibrations from the floor and improve the damping performance.

The wafer stage 4 is separated from vibrations from the floor. For this purpose, single-phase linear motors 26 are arranged parallel to stage air mounts 27 in order to improve the damping characteristic against a high frequency component when the wafer stage 4 is supported via the main body air mounts 27. The single-phase linear motors 26 prevent transmission of vibrations from the floor and improve the damping performance.

Figure 12A:
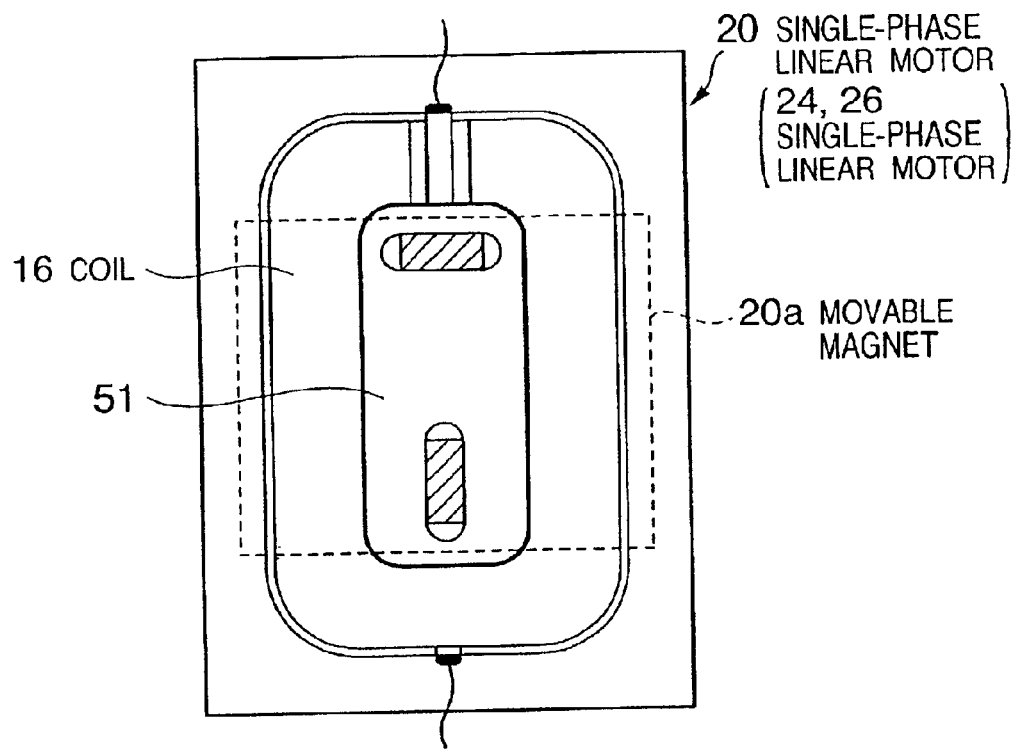
Figure 12B:
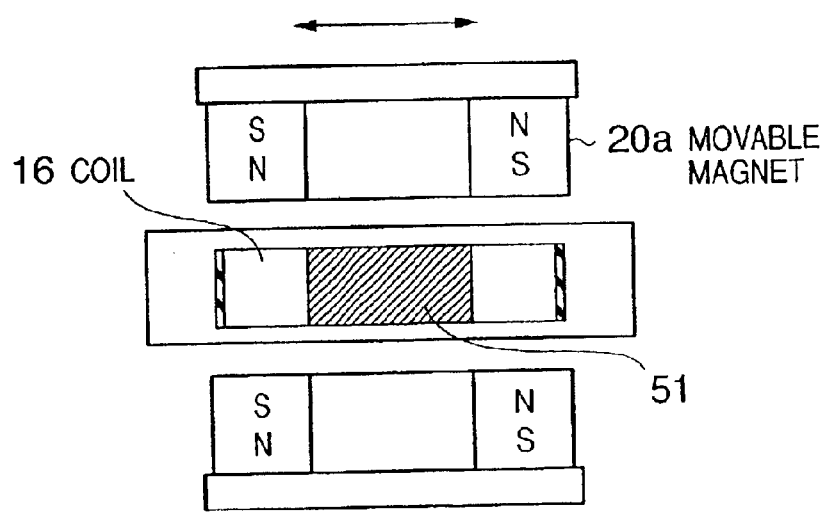

Each of the single-phase linear motors 20, 24, and 26 in this structure is realized by one coil 16 as a stationary coil prepared by winding a foil coil 16a with a core member in a multilayered structure, as shown in FIGS. 12A and 12B. Movable magnets 20a are laid out in a magnetized pattern as shown in FIG. 12B such that the polarities of adjacent magnets become opposite. With this arrangement, a high-efficiency single-phase linear motor in which the coil 16 can be fixed with high precision without damaging it in assembly can be realized with high reliability.

The linear motor according to the first or second embodiment described above can be applied to linear motors for driving the wafer and reticle stages 4 and 2.

<Embodiment of Semiconductor Production System>

A production system for a semiconductor device (semiconductor chip such as an IC or LSI, liquid crystal panel, CCD, thin-film magnetic head, micromachine, or the like) using the exposure apparatus according to the present invention will be exemplified. A trouble remedy or periodic maintenance of a manufacturing apparatus installed in a semiconductor manufacturing factory, or maintenance service such as software distribution is performed by using a computer network outside the manufacturing factory.

Figure 18:
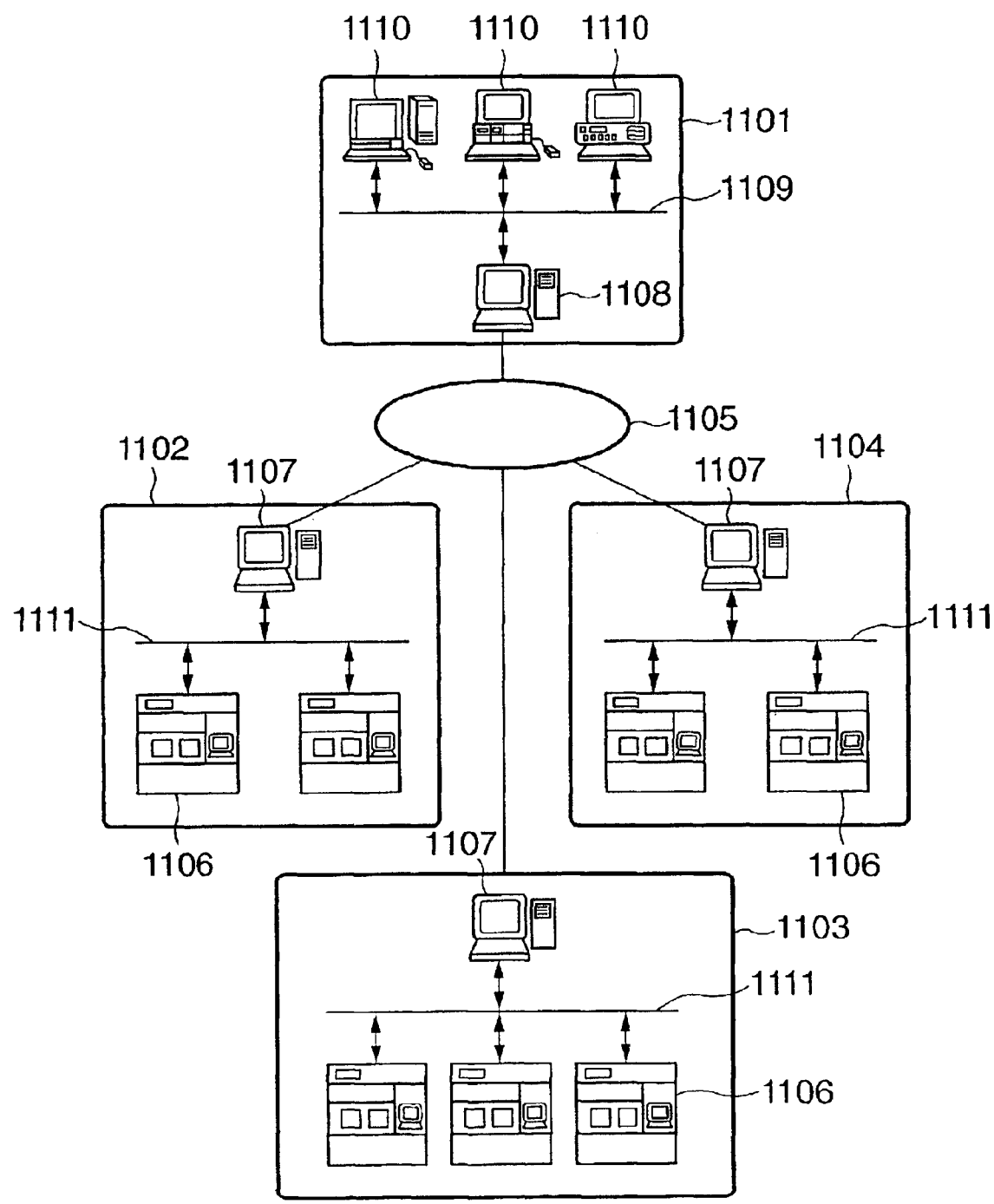
FIG. 18 is a view showing the concept of a semiconductor device production system using an apparatus according to the present invention when viewed from a given angle.

FIG. 18 shows the overall system cut out at a given angle. In FIG. 18, reference numeral 1101 denotes a business office of a vendor (apparatus supply manufacturer) which provides a semiconductor device manufacturing apparatus. Examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 1101 comprises a host management system 1108 for providing a maintenance database for the manufacturing apparatus, a plurality of operation terminal computers 1110, and a LAN (Local Area Network) 1109 which connects the host management system 1108 and computers 1110 to build an intranet. The host management system 1108 has a gateway for connecting the LAN 1109 to Internet 1105 as an external network of the business office, and a security function for limiting external accesses.

Reference numerals 1102 to 1104 denote manufacturing factories of the semiconductor manufacturer as users of manufacturing apparatuses. The manufacturing factories 1102 to 1104 may belong to different manufacturers or the same manufacturer (pre-process factory, post-process factory, and the like). Each of the factories 1102 to 1104 is equipped with a plurality of manufacturing apparatuses 1106, a LAN (Local Area Network) 1111 which connects these apparatuses 1106 to construct an intranet, and a host management system 1107 serving as a monitoring apparatus for monitoring the operation status of each manufacturing apparatus 1106. The host management system 1107 in each of the factories 1102 to 1104 has a gateway for connecting the LAN 1111 in the factory to the Internet 1105 as an external network of the factory. Each factory can access the host management system 1108 of the vendor 1101 from the LAN 1111 via the Internet 1105. The security function of the host management system 1108 authorizes access of only a limited user. More specifically, the factory notifies the vendor via the Internet 1105 of status information (e.g., the symptom of a manufacturing apparatus in trouble) representing the operation status of each manufacturing apparatus 1106, and receives response information (e.g., information designating a remedy against the trouble, or remedy software or data) corresponding to the notification, or maintenance information such as the latest software or help information. Data communication between the factories 1102 to 1104 and the vendor 1101 and data communication via the LAN 1111 in each factory adopt a communication protocol (TCP/IP) generally used in the Internet. Instead of using the Internet as an external network of the factory, a dedicated network (e.g., ISDN) having high security which inhibits access of a third party can be adopted. Also the user may construct a database in addition to the one provided by the vendor and set the database on an external network, and the host management system may authorize access to the database from a plurality of user factories.

Figure 19:
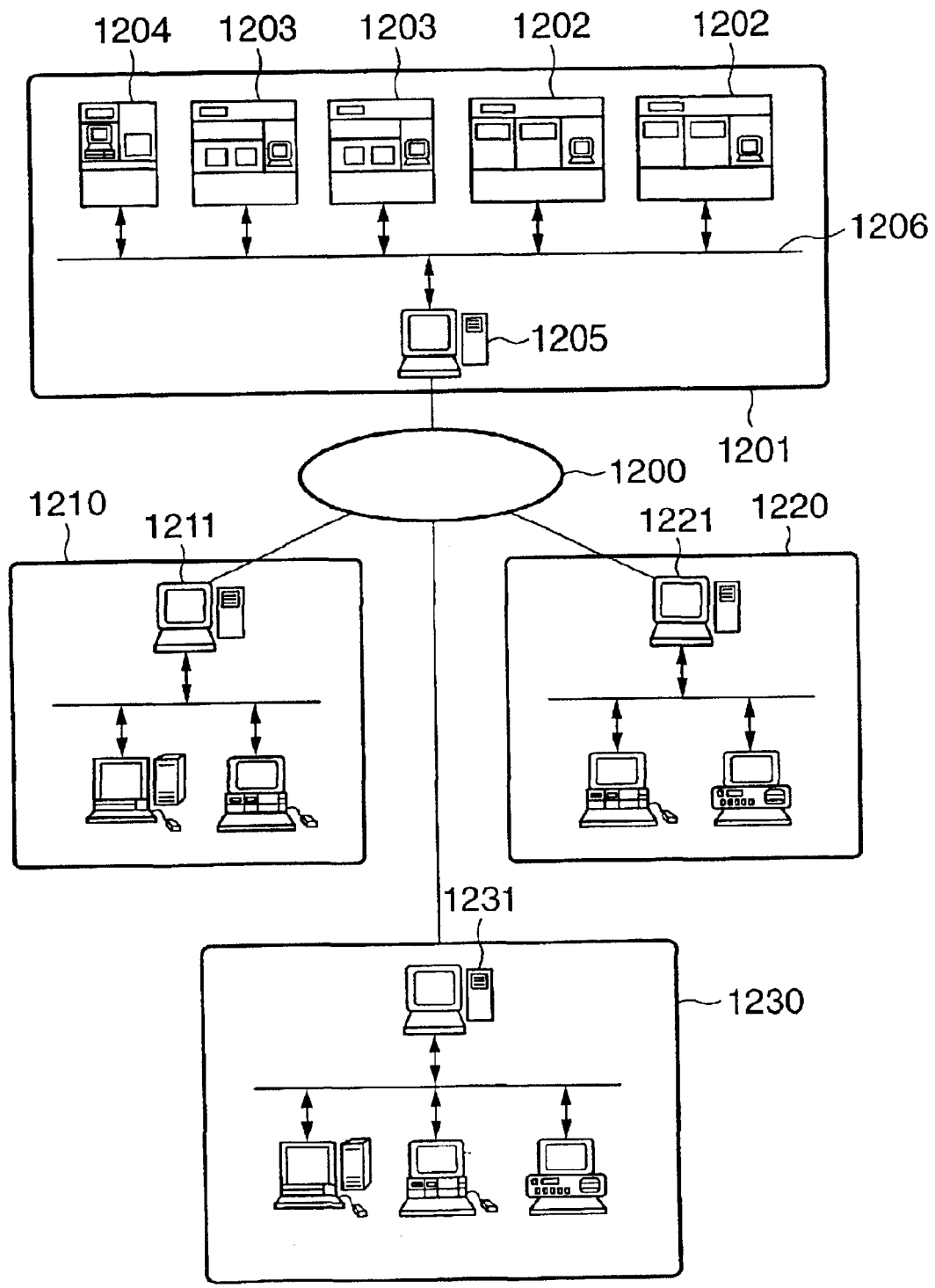
FIG. 19 is a view showing the concept of the semiconductor device production system using the apparatus according to the present invention when viewed from another angle.

FIG. 19 is a view showing the concept of the overall system of this embodiment that is cut out at a different angle from FIG. 18. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 19, a factory having manufacturing apparatuses of a plurality of vendors and the management systems of the vendors for these manufacturing apparatuses are connected via the external network of the factory, and maintenance information of each manufacturing apparatus is communicated. In FIG. 19, reference numeral 1201 denotes a manufacturing factory of a manufacturing apparatus user (semiconductor device manufacturer) where manufacturing apparatuses for various processes, e.g., an exposure apparatus 1202, resist processing apparatus 1203, and film formation apparatus 1204 are installed in the manufacturing line of the factory. FIG. 19 shows only one manufacturing factory 1201, but a plurality of factories are networked in practice. The respective apparatuses in the factory are connected to a LAN 1206 to build an intranet, and a host management system 1205 manages the operation of the manufacturing line.

The business offices of vendors (apparatus supply manufacturers) such as an exposure apparatus manufacturer 1210, resist processing apparatus manufacturer 1220, and film formation apparatus manufacturer 1230 comprise host management systems 1211, 1221, and 1231 for executing remote maintenance for the supplied apparatuses. Each host management system has a maintenance database and a gateway for an external network, as described above. The host management system 1205 for managing the apparatuses in the manufacturing factory of the user, and the management systems 1211, 1221, and 1231 of the vendors for the respective apparatuses are connected via the Internet or dedicated network serving as an external network 1200. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 1200. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 20 on the display. While referring to this window, the operator who manages manufacturing apparatuses in each factory inputs, in input items on the windows, pieces of information such as the type of manufacturing apparatus 1401, serial number 1402, subject of trouble 1403, occurrence date 1404, degree of urgency 1405, symptom 1406, remedy 1407, and progress 1408. The pieces of input information are transmitted to the maintenance database via the Internet, and appropriate maintenance information is sent back from the maintenance database and displayed on the display. The user interface provided by the web browser realizes hyperlink functions 1410 to 1412, as shown in FIG. 20. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention. The maintenance information provided by the maintenance database also includes information about the present invention described above. The software library also provides the latest-version software for implementing the present invention.

Figure 21:
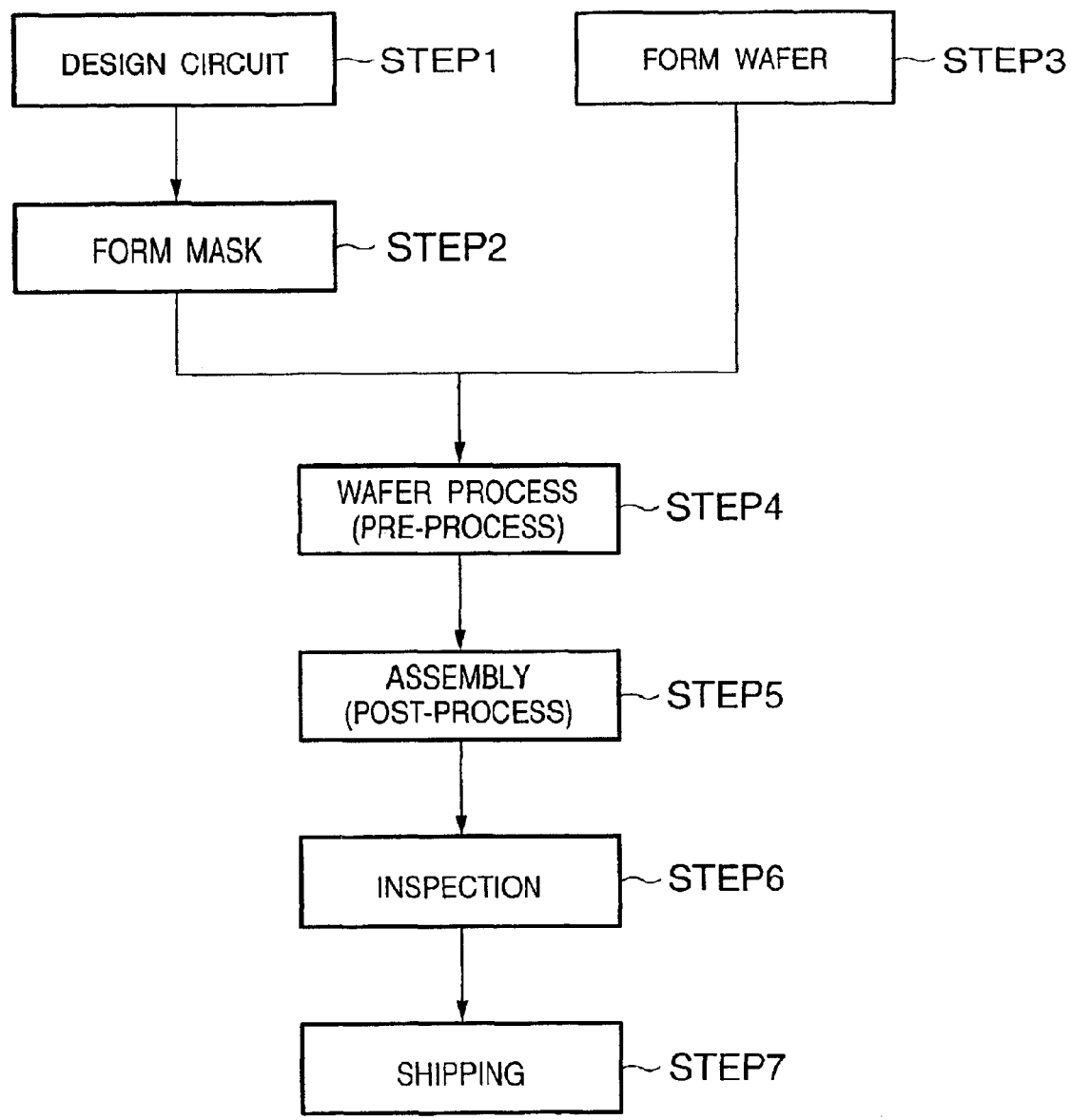
FIG. 21 is a flow chart for explaining the flow of a device manufacturing process.

A semiconductor device manufacturing process using the above-described production system will be explained. FIG. 21 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 22:
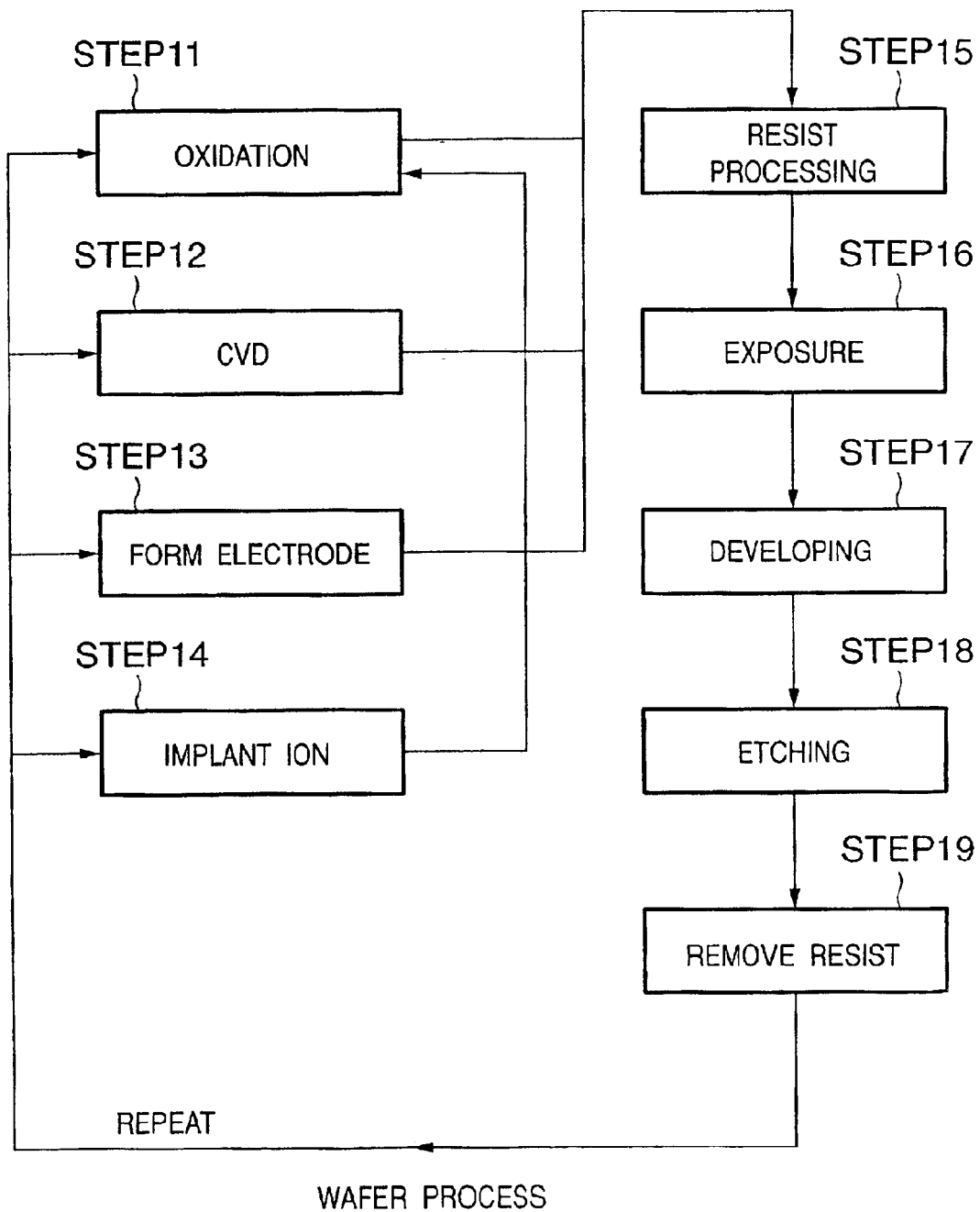
FIG. 22 is a flow chart for explaining a wafer.

FIG. 22 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if a trouble occurs, the manufacturing apparatus can be quickly recovered. The productivity of the semiconductor device can be increased in comparison with the prior art.

In the linear motor according to the present invention, a coil is formed by winding a foil coil made of a foil-like conductor around a core member in a multilayered structure. The coil can attain high fixing precision and high reliability. This increases the positioning precision and reliability of the linear motor and the exposure precision and reliability of an exposure apparatus.

A linear motor for transmitting the reaction force of a substrate stage or the like or a damping linear motor on the mount of a main body structure which supports each stage and a beam-related part such as a projection optical system is increased in driving precision and reliability. A high-reliability exposure apparatus capable of further increasing the exposure precision can be implemented.

By forming the core member from an insulating material, electrical insulation of the foil-like conductor can be easily established. By forming the core member from a high-thermal-conductivity material, heat generated by the coil can be efficiently removed outside. If the core member and coil fixing portion are made of the same material or materials having almost the same thermal expansion coefficient, a change in relative positional relationship can be reduced. By forming the core member from a ceramic whose thermal conductivity is low, a temperature rise of a linear motor housing or the like can be suppressed.

If the core member is formed from an easily moldable material such as a resin, low cost and-high coil fixing precision can be realized. Since the core member also serves as a winding jig used to form a coil, the winding jig removal step can be eliminated, and a decrease in the precision of the inner coil circumferential surface functioning as a positioning portion or damage to a wire can be prevented.

As many apparently widely different embodiments of the present invention can be made without departing from the spirit and scope thereof, it is to be understood that the invention is not limited to the specific embodiments thereof except as defined in the claims.

What is claimed is:

1. A linear motor comprising:
   a plurality of wires used for forming a plurality of coils;
   a plurality of core members, wherein each of said coils is formed by winding directly to each of said core members and each of said core members is used for fixing each of said wound coils to each of a plurality of fixing portions corresponding to each of said core members; and
   a fixing member which has the plurality of fixing portions and fixes each of the plurality of coils formed by using each of the plurality of core members to each of the plurality of fixing portions.

2. The motor according to claim 1, wherein said core member is formed from an insulating material.

3. The motor according to claim 1, wherein said core member is formed from a material having a low thermal conductivity.

4. The motor according to claim 1, wherein said core member is formed from the same material as a material of said coil fixing portion or a material having substantially the same linear expansion coefficient.

5. The motor according to claim 1, wherein said core member is formed from a ceramic.

6. The motor according to claim 1, wherein said core member is formed from a resin material.

7. The motor according to claim 6, wherein said core member is annular and is fixed by being fitted on said coil fixing portion.

8. The motor according to claim 1, wherein an outer circumferential surface of said coil is covered with an electrically insulating material.

9. The motor according to claim 1, wherein said coil fixing portion is shaped such that an area in a direction in which a large force is received under influence of a magnetic field is larger than an area in a direction in which a small force is received.

10. The motor according to claim 1, wherein said each of the plurality of coils is formed as coils wound with the laminated foil-like conductors.

11. The motor according to claim 1, wherein said fixing member has a plurality of positioning portions, and each of the plurality of positioning portions engages each of the plurality of core members, thereby the core members are positioned.

12. The motor according to claim 1, wherein each of the plurality of core members forms a positioning hole to engage each of the plurality of positioning portions.

* * * * *

UNITED STATES PATENT AND TRADEMARK OFFICE
CERTIFICATE OF CORRECTION

PATENT NO. : 6,836,031 B2
DATED : December 28, 2004
INVENTOR(S) : Keiji Emoto et al.

It is certified that error appears in the above-identified patent and that said Letters Patent is hereby corrected as shown below:

Column 1,
Line 28, "covering an" should read -- covering and --.
Line 32, "conductor-wounded" should read -- conductor-wound --.
Line 43, "wounded" should read -- wound --.

Column 2,
Lines 17, 21 and 61, "wounded" should read -- wound --.

Column 6,
Line 64, "wounded." should read -- wound. --.

Column 7,
Line 3, "wounded" should read -- wound --.
Line 10, "like" should read -- line --.

Column 14,
Line 43, "and-high" should read -- and high --.

Signed and Sealed this

Seventeenth Day of May, 2005

JON W. DUDAS
*Director of the United States Patent and Trademark Office*